(12) United States Patent
Lee et al.

(10) Patent No.: US 9,379,023 B2
(45) Date of Patent: Jun. 28, 2016

(54) SEMICONDUCTOR DEVICE WITH METAL GATE AND HIGH-K MATERIALS AND METHOD FOR FABRICATING THE SAME

(71) Applicant: SK hynix Inc., Gyeonggi-do (KR)

(72) Inventors: Seung-Mi Lee, Gyeonggi-do (KR); Yun-Hyuck Ji, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/669,968

(22) Filed: Mar. 26, 2015

(65) Prior Publication Data

US 2015/0206805 A1 Jul. 23, 2015

Related U.S. Application Data

(62) Division of application No. 13/845,245, filed on Mar. 18, 2013, now Pat. No. 9,018,710.

(30) Foreign Application Priority Data

Dec. 28, 2012 (KR) .......................... 10-2012-0157305

(51) Int. Cl.
*H01L 21/8238* (2006.01)
*H01L 21/3213* (2006.01)
*H01L 21/3215* (2006.01)
*H01L 27/092* (2006.01)

(52) U.S. Cl.
CPC .... *H01L 21/823807* (2013.01); *H01L 21/3215* (2013.01); *H01L 21/32133* (2013.01); *H01L 21/823842* (2013.01); *H01L 21/823857* (2013.01); *H01L 27/092* (2013.01)

(58) Field of Classification Search
CPC .................. H01L 21/823842; H01L 29/7831; H01L 27/092

USPC ........................................... 438/217; 257/369
See application file for complete search history.

(56) References Cited

U.S. PATENT DOCUMENTS

| | | | | |
|---|---|---|---|---|
| 8,067,806 B2* | 11/2011 | Lin | .................... | H01L 21/28088 257/369 |
| 8,536,005 B2* | 9/2013 | Maruyama | ...... | H01L 21/823857 257/E21.635 |
| 8,921,935 B2* | 12/2014 | Park | .................. | H01L 29/66659 257/336 |
| 2007/0057335 A1* | 3/2007 | Tsuchiya | .......... | H01L 21/28097 257/412 |
| 2008/0079086 A1* | 4/2008 | Jung | ............... | H01L 21/823807 257/369 |
| 2009/0261424 A1* | 10/2009 | Chang | ............... | H01L 21/28088 257/392 |
| 2011/0062524 A1* | 3/2011 | Lin | .................... | H01L 21/28088 257/369 |
| 2012/0049288 A1* | 3/2012 | Maruyama | ...... | H01L 21/823857 257/369 |
| 2012/0175703 A1* | 7/2012 | Park | .................. | H01L 29/66659 257/336 |
| 2013/0105905 A1* | 5/2013 | Ji | ....................... | H01L 21/28202 257/369 |
| 2013/0256805 A1* | 10/2013 | Chuang | ........... | H01L 21/823842 257/369 |

\* cited by examiner

*Primary Examiner* — Moazzam Hossain
(74) *Attorney, Agent, or Firm* — IP & T Group LLP

(57) ABSTRACT

A semiconductor device includes a substrate including first and second regions. A first gate stack structure containing a first effective work function adjust species is formed over the first region and a second gate stack structure containing a second effective work function adjust species is formed over the second region. A channel region is formed under the first gate stack structure and contains a threshold voltage adjust species.

8 Claims, 9 Drawing Sheets

SEMICONDUCTOR DEVICE WITH METAL GATE AND HIGH-K MATERIALS AND METHOD FOR FABRICATING THE SAME

CROSS-REFERENCE TO RELATED APPLICATIONS

This application is a division of U.S. patent application Ser. No. 13/845,245 filed on Mar. 18, 2013, which claims priority of Korean Patent Application No. 10-2012-0157305, filed on Dec. 28, 2012. The disclosure of each of the foregoing application is incorporated herein by reference in its entirety.

BACKGROUND

1. Field

Exemplary embodiments of the present invention relate to a semiconductor device, and more particularly, to a semiconductor device with a metal gate and a high-k materials and a method for fabricating the same.

2. Description of the Related Art

A CMOS device needs to lower the threshold voltages of N-channel and P-channel transistors, in order to perform a high-speed operation. N-type polysilicon has been used as a gate electrode of the N-channel transistor, and P-type polysilicon has been used as a gate electrode of the P-channel transistor.

However, with the decrease in size of transistors, the degradation of drive current is caused by depletion of polysilicon in the CMOS device. The depletion of polysilicon refers to a phenomenon in which the doping concentration of a dopant decreases at an interface with a gate dielectric layer. The dopant implanted in the polysilicon may be diffused out by a subsequent thermal process or the like. In this case, the doping concentration of the dopant decreases.

Therefore, the N-type polysilicon and the P-type polysilicon have a limitation in optimizing the threshold voltages of the respective transistors.

Recently, a transistor with a metal gate electrode, in which a metal is used as the material of a gate electrode, has been developed in correspondence to the miniaturization of transistors. A metal with a low work function is used for the N-channel transistor, and a metal with a high work function is used for the P-channel transistor. Here, the metal with a low work function is a material having a value corresponding to a work function (4.1 eV or less) of the N-type polysilicon, and the metal with a high work function is a material having a value corresponding to a work function (4.7 eV or more) of the P-type polysilicon.

However, there is a limitation in adjusting the threshold voltages of the respective transistors to sufficiently low values, only through the method of adjusting the work functions of the metals. Furthermore, since a process for adjusting the work functions suitable for the N-channel transistor and the P-channel transistor is very complex, productivity inevitably decreases.

SUMMARY

Various embodiments are directed to a semiconductor device capable of independently optimizing threshold voltages of an N-channel transistor and a P-channel transistor, and a method for fabricating the same.

In accordance with an exemplary embodiment of the present invention, a semiconductor device comprises a substrate comprising first and second regions; a first gate stack structure formed over the first region, the first gate stack structure comprising: a first gate dielectric layer, a first metal-containing gate electrode formed over the first gate dielectric layer, the first metal-containing gate electrode containing a first effective work function adjust species, and an effective work function promotion layer formed over the first metal-containing gate electrode; a second gate stack structure formed over the second region, the second gate stack structure comprising: a second gate dielectric layer, a second metal-containing gate electrode formed over the second gate dielectric layer, the second metal-containing gate electrode containing a second effective work function adjust species that is different than the first effective work function adjust species, and a dipole formation layer formed between the second gate dielectric layer and the second metal-containing gate electrode; and a channel region formed under the first gate stack structure and containing a threshold voltage adjust species.

In accordance with another exemplary embodiment of the present invention, a semiconductor device comprises a substrate comprising a P-channel transistor region and an N-channel transistor region; a first gate stack structure formed over the P-channel transistor region, the first gate stack structure comprising: a first gate dielectric layer, a nitrogen-rich (N-rich) titanium nitride (TiN) formed over the first gate dielectric layer, and a TiN containing aluminum formed over the N-rich TiN; a second gate stack structure formed over the N-channel transistor region, the second gate stack structure comprising: a second gate dielectric layer, a titanium-rich (Ti-rich) TiN formed over the second gate dielectric layer, and a dipole formation layer formed between the second gate dielectric layer and the Ti-rich TiN; and a P-channel region, containing germanium (Ge), formed under the first gate stack structure.

In accordance with still another exemplary embodiment of the present invention, a method for fabricating a semiconductor device, the method comprises forming a threshold voltage adjust region under a surface of a first region of a substrate that includes the first region and a second region; forming a gate dielectric layer over the first region and the second region; forming a first metal-containing layer containing a first effective work function adjust species over the gate dielectric layer formed over first region; forming a second metal-containing layer containing a second effective work function adjust species over the gate dielectric layer formed over the second region and over the first metal-containing layer; forming a dipole formation region at an interface between the second metal-containing layer and the gate dielectric layer; forming an effective work function promotion layer at an interface between the first metal-containing layer and the second metal-containing layer; forming, in the first region, a first gate stack structure by etching the second metal-containing layer, the effective work function promotion layer, the first metal-containing layer, and the gate dielectric layer; and forming, in the second region, a second gate stack structure by etching the second metal-containing layer, the dipole formation layer, and the gate dielectric layer.

DETAILED DESCRIPTION

Figure 1:
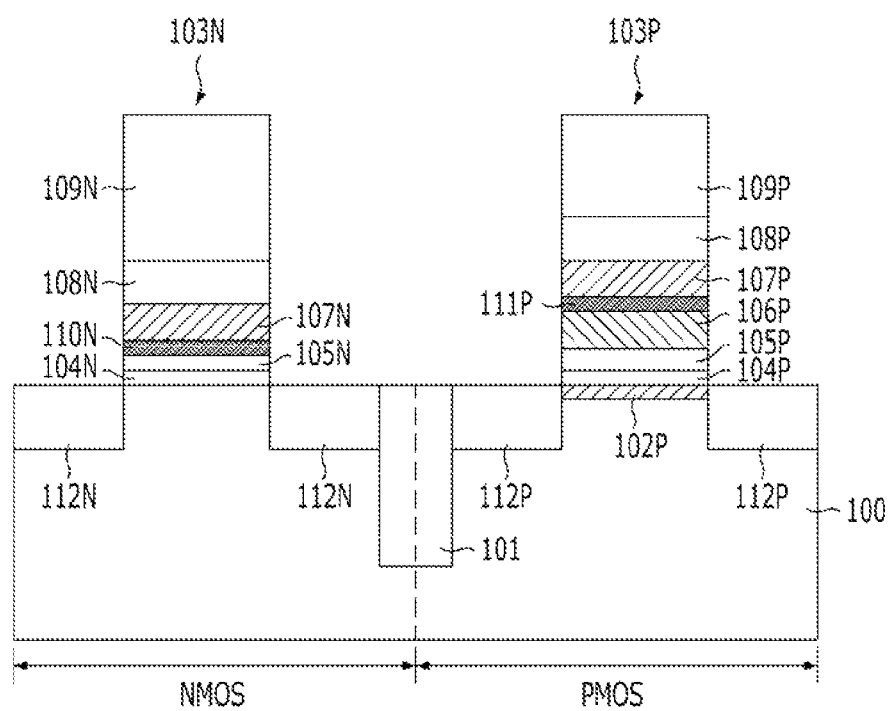
FIG. 1 is a diagram illustrating an exemplary gate stack structure.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In an exemplary embodiment, an effective work function is a value calculated from a flat band based on capacitance-voltage (C-V) measurement of a gate dielectric layer and a gate electrode, and is influenced by the material of the gate dielectric layer and the interfacial characteristic between the gate dielectric layer and the gate electrode as well as the unique work function of a material used as the gate electrode. The effective work function is distinguished from the unique work function of the material forming the gate electrode. The effective work function of the gate electrode may be varied by a deposition method and condition for the material used as the gate electrode and the types of elements contained in the material. The effective work function of a gate stack structure may be adjusted by controlling the effective work function of the gate electrode.

FIG. 1 is a diagram illustrating an exemplary gate stack structure. FIG. 1 illustrates a gate stack structure of a CMOS device, although the present invention is not limited thereto.

Referring to FIG. 1, a substrate 100 includes first and second regions. The first and second regions are isolated by an isolation region 101. The first and second regions may include transistor regions. For example, the first region is where a P-channel transistor may be formed in the first region (PMOS), and an N-channel transistor may be formed in the second region (NMOS).

A first gate stack structure 103P is formed over the substrate 100 of the first region PMOS, and a second gate stack structure 103N is formed over the substrate 100 of the second region NMOS.

The first gate stack structure 103P includes a first dielectric layer 105P, a first metal-containing gate electrode 106P, an effective work function promotion layer 111P, a metal-containing layer pattern 107P, a first buffer layer 108P, and a first capping layer 109P, which are sequentially stacked.

The second gate stack structure 103N includes a second dielectric layer 105N, a dipole formation layer 110N a second metal-containing gate electrode 107N, a second buffer layer 108N, and a second capping layer 109N, which are sequentially stacked.

As such, the gate stack structures of the first and second regions PMOS and NMOS have different structures. The first and second gate stack structures 103P and 103N further include first and second interface layers 104P and 104N formed under the first and second gate dielectric layers 105P and 105N, respectively. A threshold voltage adjust region 102P is formed in the substrate 100 under the second gate stack structure 103P. That is, the threshold voltage adjust region 102P is formed in a channel region. The threshold voltage adjust region 102P is formed of a crystalline material, and may include a large amount of germanium. The threshold voltage adjust region 102P may have a silicon-germanium structure.

The dipole formation layer 110N included in the second gate stack structure 103N is positioned at the interface between the second gate dielectric layer 105N and the second metal-containing gate electrode 107N so as to form a dipole. As such, the dipole is formed to shift the threshold voltage of the transistor. The dipole formation layer 110N may include elements having different electronegativities. For example, the dipole formation layer 110N may include first and second elements, and the first element may have a higher or lower electronegativity than the second element. In an exemplary embodiment, the first element may have a higher electronegativity than the second element. The first element may include nitride. According to a periodic table of electronegativities, using a falling scale, nitrogen has an electronegativity of about 3.04. The second element may be selected from elements having a lower electronegativity than nitrogen. The second element may include an element by which an implant process may be easily performed. Furthermore, the second element may include an element which does not degrade the second gate dielectric layer 105N. In an exemplary embodiment, the second element may include arsenic (As). According to a periodic table of electronegativities, using a falling scale, arsenic may be easily implanted by an implant process, and has an electronegativity of about 2.18 which is much lower than that of nitrogen.

As such, the dipole formation layer 110N includes the first element with a first electronegativity and the second element with a second electronegativity. The first electronegativity may have a value greater than the second electronegativity, and thus dipoles are formed. The dipole formation layer 109N may include nitrogen and arsenic. Since nitrogen and arsenic have different electronegativities, the dipoles may be formed by such an electronegativity difference therebetween.

The first and second interface layers 104P and 104N may include silicon oxide or silicon nitride. For example, the first and second interface layers 104P and 104N may include $SiO_2$ or SiON. The first and second interface layers 104P and 104N may improve the interface characteristics between the substrate 100 and the first and second gate dielectric layers 105P and 105N so as to improve an electron mobility characteristic.

The first and second gate dielectric layers 105P and 105N include high-k materials having a high dielectric constant. The high-k materials have a dielectric constant greater than the dielectric constant (about 3.9) of $SiO_2$. Furthermore, the high-k materials have a considerably greater physical thickness and a smaller equivalent oxide thickness (EOT) than $SiO_2$. Furthermore, the high-k materials may have a dielectric constant greater than the first and second interface layers 104P and 104N.

The first and second gate dielectric layers 105P and 105N include a metal-containing material such as metal oxide, metal silicate, or metal silicate nitride. The metal oxide includes a metal, such as hafnium (Hf), aluminum (Al), lanthanum (La), or zirconium (Zr). The metal oxide may include hafnium oxide, aluminum oxide, lanthanum oxide, zirconium oxide, or a combination thereof. For example, the meta oxide may include $HfO_2$, $Al_2O_3$, $ZrO_2$, or a combination thereof. The metal silicate includes a metal such as Hf or Zr. For example, the metal silicate may include hafnium silicate (HfSiO), zirconium silicate (ZrSiO), or a combination thereof. The metal silicate nitride may include hafnium silicate nitride (HfSiON), zirconium silicate nitride (ZrSiON), or a combination thereof.

The second metal-containing gate electrode 107N includes a low effective work function material, and the first metal-containing gate electrode 106P includes a high effective work function material.

The first metal-containing gate electrode 106P may contain a first effective work function adjust species. Due to the first effective work function adjust species, the first gate stack structure 103P has an effective work function suitable for the P-channel transistor. The first metal-containing gate electrode 106P may include a P-type effective work function metal-containing layer. Therefore, the first metal-containing gate electrode 106P may become a P-type effective work function metal-containing gate electrode. The P-type effective work function metal-containing gate electrode may include a material having an effective work function of 4.7 eV or more (4.7 to 5.1 eV). The P-type effective work function has substantially the same value as the work function of P-type polysilicon. The P-type effective work function metal-containing gate electrode has an effective work function greater than a midgap work function. The first effective work function adjust species may include an effective work function increase species to increase the effective work function. As the effective work function increase species is contained, the effective work function of the first gate structure 103P is increased. As such, the first metal-containing gate electrode 106P, containing the effective work function increase species, may be referred to as a high effective work function material.

The effective work function increase species may include nitrogen. The first metal-containing gate electrode 106P may include nitrogen as the first effective work function adjust species. The first metal-containing gate electrode 106P may include a metal nitride containing the first effective work function adjust species. The first metal-containing gate electrode 106P may include a nitrogen-rich metal nitride that contains nitrogen at a ratio greater than a chemical stoichiometric ratio of metal to nitrogen. Here, the nitrogen contained at a higher ratio in the nitrogen-rich metal nitride becomes the first effective work function adjust species.

The metal nitride may include titanium nitride. If the first effective work function adjust species includes nitrogen, then the first metal-containing gate electrode 106P may include nitrogen-rich TiN (N-rich TiN). The N-rich TiN refers to titanium nitride containing nitrogen at a ratio greater than a chemical stoichiometric ratio of titanium to nitrogen. The TiN has a different effective work function depending on a composition ratio of titanium to nitrogen. For example, the N-rich TiN may have a P-type effective work function suitable for the P-channel transistor. Since the N-rich TiN may be formed by a physical vapor deposition (PVD) method, the composition ratio of titanium to nitrogen within TiN may be easily adjusted. The N-rich TiN is formed as the first metal-containing gate electrode 106P. When the N-rich TiN is formed, a flow rate of nitrogen may be selectively controlled to adjust the composition ratio of nitrogen and titanium. As such, the flow rate of nitrogen may be controlled to form the N-rich TiN having a P-type effective work function. The N-rich TiN may be formed by an atomic layer deposition (ALD) method.

The second metal-containing gate electrode 107N may contain a second effective work function adjust species. Due to the second effective work function adjust species, the second gate stack structure 103N has an effective work function suitable for the N-channel transistor. The second metal-containing gate electrode 107N may include an N-type effective work function metal-containing layer. Therefore, the second metal-containing gate electrode 107N may become an N-type effective work function metal-containing gate electrode. The N-type effective work function metal-containing gate electrode may include a material having an effective work function of 4.5 eV or less (4.1 to 4.5 eV). The N-type effective work function has substantially the same value as the work function of N-type polysilicon. The N-type effective work function metal-containing gate electrode has an effective work function smaller than a midgap work function. The second effective work function adjust species may include an effective work function decrease species to decrease the effective work function. As the effective work function decrease species is contained, the effective work function of the second gate structure 103N decreases. As such, the second metal-containing gate electrode 107N containing an effective work function decrease species may be referred to as a low effective work function material.

The effective work function decrease species may include a metal. The second metal-containing gate electrode 107N may include a metal as the second effective work function adjust species. The second metal-containing gate electrode 107N may include metal nitride containing the second effective work function adjust species. The second metal-containing gate electrode 107N may Include metal-rich metal nitride which contains a metal at a ratio greater than a chemical stoichiometric ratio of metal to nitrogen. Here, the metal contained at a higher ratio in the metal-rich metal nitride becomes the second effective work function adjust species.

The metal nitride serving as the second metal-containing gate electrode 107N may include TiN. If the second effective work function adjust species contains titanium, then the second metal-containing gate electrode 107N may include titanium-rich TiN (Ti-rich TiN). The Ti-rich TiN refers to TiN containing titanium at a ratio greater than a chemical stoichiometric ratio of titanium to nitrogen. TiN has a different work function depending on the comparison ratio of titanium to nitrogen. For example, the Ti-rich TiN may have an N-type effective work function suitable for the N-channel transistor. Since the Ti-rich TiN may be formed by a PVD method, the composition ratio of titanium to nitrogen inside TiN may be easily controlled. The Ti-rich TiN is formed as the second metal-containing gate electrode 107N. When the Ti-rich TiN is formed, a flow rate of nitrogen may be selectively controlled to adjust the composition ratio of titanium to nitrogen. As such, the flow rate of nitrogen may be controlled to form the Ti-rich TiN having an N-type effective work function. The Ti-rich TiN may be formed by an ALD method.

The metal-containing layer pattern 107P formed over the first metal-containing gate electrode 106P may be formed of substantially the same material as the second metal-containing gate electrode 107N.

The effective work function promotion layer 111P is formed between the first metal-containing gate electrode 106P and the metal-containing layer pattern 107P. The effective work function promotion layer 111P may be formed of an aluminum-containing material. For example, the effective work function promotion layer 111P may include aluminum-containing titanium nitride. Preferably, the effective work function promotion layer 111P may include titanium aluminum nitride (TiAlN). The effective work function of the first gate stack structure 103P is increased by Al. Furthermore, a reaction between the first metal-containing gate electrode 106P and the metal-containing layer pattern 107P is prevented by the effective work function promotion layer 111P. Therefore the effective work function of the first gate stack structure 103P may be prevented from decreasing. The effective work function promotion layer 111P is a high effective work function material to increase the effective work function, and serves as an anti-reaction layer.

The first and second buffer layers 108P and 108N are materials for relieving an impact during an implant process. The first and second buffer layers 108P and 108N may include a silicon-containing material. The first and second buffer layers 108P and 108N may include silicon, and silicon may include undoped silicon.

The first and second capping layers 109P and 109N may include a silicon-containing layer. The first and second capping layers 109P and 109N may include doped silicon. For example, the first and second capping layers 109P and 109N may include N-type silicon or P-type silicon. The first and second buffer layers 108P and 108N and the first and second capping layers 109P and 109N may serve as an anti-oxidation layer to prevent oxidation of the second metal-containing gate electrode 107N and the metal-containing layer pattern 107P, respectively. The first and second capping layers 109P and 109N may include doped silicon. The conductive type of doped silicon may include an N-type or P-type, regardless of the N-channel transistor and the P-channel transistor. That is, N-type silicon or P-type silicon may be used in the second region NMOS, and N-type silicon or P-type silicon may be used in the first region PMOS. Furthermore both of the first and second regions PMOS and NMOS may be formed of N-type silicon or P-type silicon. Accordingly, the first and second capping layers 109P and 109N of the first and second regions PMOS and NMOS may be formed of the same material or materials having the same conductive type.

Although not illustrated, a low resistance metal-containing layer may be further formed over the first and second capping layers 109P and 109N. The low resistance metal-containing layer may include tungsten. The low resistance metal-containing layer serves to reduce the resistance of the gate stack structure.

A first source and drain 112P are formed in the substrate 100 at both sides of the first gate stack structure 103P. A second source and drain 112N are formed in the substrate 100 at both sides of the second gate stack structure 103N. The first source and drain 112P include a P-type source and drain, and the second source and drain regions 112N include an N-type source and drain.

The threshold voltage adjust region 102P is formed in the substrate 100 under the first gate stack structure 103P. The threshold voltage adjust region 102P contains a large amount of germanium. The threshold voltage adjust region 102P may have a silicon-germanium structure containing a large amount of germanium.

Referring to FIG. 1, a first transistor including the first gate stack structure 103P and a second transistor including the second gate stack structure 103N are formed in the substrate 100. The first transistor is a P-channel transistor including PMOS, and the second transistor is an N-channel transistor including NMOS. The first transistor includes the threshold voltage adjust region 102P formed in the channel region thereof. The first gate stack structure 103P includes the first metal-containing gate electrode 106P formed of a high effective work function material, the effective work function promotion layer 111P formed over the first metal-containing gate electrode 106P, and the metal-containing layer pattern 107P formed of a low effective work function material. The second gate stack structure 103N includes the second metal-containing gate electrode 107N formed of a low effective work function material.

In accordance with an exemplary embodiment, the second gate stack structure 103N includes the dipole formation layer 110N formed at the interface between the second metal-containing gate electrode 107N, and the second gate dielectric layer 105N. Accordingly, the threshold voltage of the N-channel transistor may be reduced. Specifically, a dipoles is formed according to a difference in electronegativity between the elements contained in the dipole formation layer 110N formed at the interface between the second metal-containing gate electrode 107N and the second gate dielectric layer 105N, and reduce the threshold voltage of the N-channel transistor. Furthermore, since the second gate stack structure 103N includes the second metal containing gate electrode 107N, which contains the effective work function decrease species, the effective work function of the second gate stack structure 103N may be decreased to further reduce the threshold voltage of the N-channel transistor.

Since the threshold voltage adjust region 102P is formed under the first gate stack structure 103P, the threshold voltage of the P-channel transistor may be reduced. Specifically, as the region containing a large amount of germanium is formed in the P-channel, the energy band gap is reduced to control the threshold voltage to a threshold voltage suitable for the P-channel transistor. Furthermore, as a high effective work function material, containing the effective work function increase species at a higher ratio, is used as the first metal-containing gate electrode 106P, the effective work function of the first gate stack structure 103P may be increased to further reduce the threshold voltage of the P-channel transistor. Furthermore, the effective work function promotion layer 111P further increases the effective work function of the first gate stack structure 103P, and prevents the effective work function of the first metal-containing gate electrode 106P from being decreased.

Therefore, the threshold voltages of the N-channel transistor and the P-channel transistor may be independently controlled during an integration process of a CMOS device.

FIGS. 2A to 2M are diagrams illustrating an exemplary method for fabricating a semiconductor device.

In an exemplary method of fabricating a CMOS device will be described. The present invention is not limited to a CMOS device, but may be applied to all methods for fabricating a semiconductor device in which an N-channel transistor and a P-channel transistor are formed. Furthermore, the present invention may be applied to a method for fabricating an N-channel transistor and a method for fabricating a P-channel transistor. The P-channel transistor may include a PMOSFET (hereafter, referred to as PMOS), and the N-channel transistor may include an NMOSFET (hereafter, referred to as an NMOS).

Figure 2A:
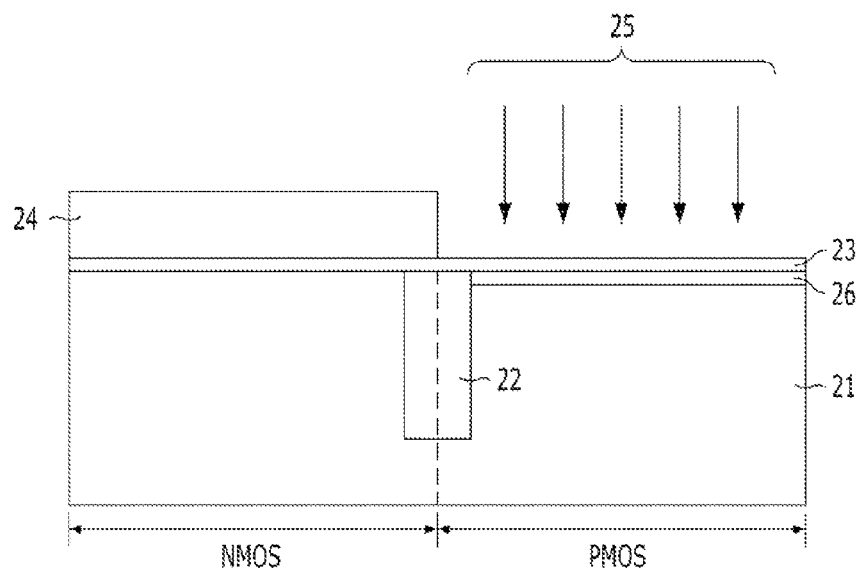
FIGS. 2A to 2M are diagrams illustrating an exemplary method for fabricating a semiconductor device.

Referring to FIG. 2A, a substrate 21 is prepared. The substrate 21 may include a plurality of regions in which a transistor is formed. The plurality of regions may include a first region PMOS and a second region NMS. The substrate 21 may include a semiconductor material. The substrate 21 may include semiconductor substrate. The substrate 21 may include a silicon substrate, a silicon germanium substrate, or a silicon-on-insulator (SOI) substrate.

An isolation region 22 is formed in the substrate 21. The isolation region 22 may be formed through a shallow trench isolation (STI) process. For example, a pad layer (not illustrated) is formed over the substrate 21, and an isolation mask (not illustrated) is used to etch the pad layer and the substrate 21. Accordingly, a trench is formed. After the trench is formed, the trench is filled with an insulator to form the isolation region 22. The isolation region 22 may include wall oxide, liner, and fill dielectric materials, which are sequentially formed therein. The liner may be formed by stacking silicon nitride and silicon oxide. The silicon nitride may include $Si_3N_4$, and the silicon oxide may include $SiO_2$. The fill dielectric materials may include a spin-on dielectric (SOD). Alternatively, the isolation region 22 may include silicon nitride as the fill dielectric material.

Then, a passivation layer 23 is formed over the entire surface of the substrate 21. The passivation layer 23 serves as a screen during a subsequent implant process. For example, the passivation layer 23 serves to minimize damage applied to the substrate 21 while a dopant or another material is implanted into the substrate 21. The passivation layer 23 may be formed by a thermal oxidation method, for example. The passivation layer 23 may include $SiO_2$. The passivation layer 23 is referred to as a screen oxide. The passivation layer 23 is formed to a thickness ranging from approximately 50 Å to approximately 100 Å.

After the passivation layer 23 is formed, a first mask pattern 24 is formed. The first mask pattern 24 opens any one of the first and second regions PMOS and NMOS. The first mask pattern 24 may open the first region PMOS.

The first mask pattern 24 is used as an implant mask to implant a threshold voltage adjust species into the first region PMOS. This process is referred to as a threshold voltage adjust species implant 25. The threshold voltage adjust species is a material for adjusting the threshold voltage of the transistor. The threshold voltage adjust species may include germanium (Ge). The threshold voltage adjust species implant 25 may include an ion implantation. The threshold voltage adjust species implant 25 may be performed at an energy ranging from approximately 1 keV to approximately 10 keV and a dose ranging from approximately $1 \times 10^{14}$ atoms/$cm^2$ to approximately $1 \times 10^{17}$ atoms/$cm^2$. The threshold voltage adjust species implant 25 may be performed in the channel region of the first region PMOS. When the dose is too low or high during the threshold voltage adjust species implant 25, the dose is not suitable for obtaining a desired electrical characteristic, because the amount of threshold voltage shift for obtaining a desired threshold voltage in the P-channel transistor is too small or large. Therefore, depending on a desired amount of threshold voltage shift, the dose and energy during the threshold voltage adjust species implant 25 may be properly decided in the range ranging from approximately $1 \times 10^{14}$ atoms/$cm^2$ to approximately $1 \times 10^{17}$ atoms/$cm^2$.

When the threshold voltage adjust species implant 25 is performed in such a manner, a threshold voltage adjust region 26 is formed to a predetermined thickness under the surface of the substrate 21 of the first region PMOS. For example, when the vth adjust species is germanium, germanium reacts with silicon of the substrate 21, thereby forming a germanium containing region with a silicon-germanium (SiGe) structure.

Although not illustrated, a typical well formation process and a typical channel formation process may be performed before the threshold voltage adjust species implant 25. An N-type well is formed in the first region PMOS, and a P-type well is formed in the second region NMOS. In order to form the P-type well, a P-type dopant, such as boron (B) or $BF_2$ may be implanted. Furthermore, in order to form the N-type well, an N-type dopant, such as phosphorus (P) or arsenic (As) may be implanted.

After the well formation process, an N-channel and a P-channel may be formed through a typical channel formation process. The N-channel may be formed in the second region NMOS, and the P-channel may be formed in the first region PMOS. In order to form the P-channel, an N-type dopant, such as phosphorus or arsenic may be implanted. In order to form the N-channel, a P-type dopant, such as boron may be implanted. The channel formation process may be performed after the threshold voltage adjust species implant 25. The threshold voltage is set by implanting the N-dopant into the channel region of the P-channel transistor, but there is a limitation in reducing the threshold voltage. Therefore, in an exemplary embodiment, as germanium is contained in the P-channel region, the energy band gap may be controlled to further reduce the threshold voltage.

Figure 2B:
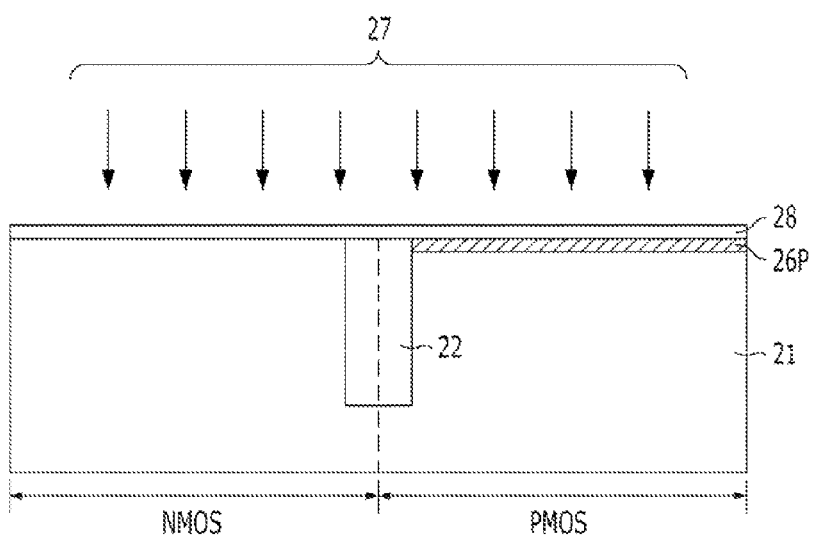

Referring to FIG. 2B, the passivation layer 23 is removed through a cleaning process. The passivation layer 23 may be removed by wet etching. For example, when the passivation layer 23 includes silicon oxide, hydrofluoric acid (HF) or a chemical including HF may be used.

Then, a post treatment 27 is performed. Through the post treatment 27, the roughness of the threshold voltage adjust region 26 may be improved. Furthermore, the threshold voltage adjust region 26 may be crystallized by the post treatment 27. In an exemplary embodiment, the post treatment 27 may include a thermal process. The post treatment 27 may include a thermal oxidation process. For example, a sacrificial oxide layer 28 may be formed through the post treatment 27. The sacrificial oxide layer 28 may be formed at a thickness ranging from approximately 30 Å to approximately 100 Å under a temperature condition ranging from approximately 750 to approximately 900° C. The sacrificial layer 28 may include silicon oxide.

As the sacrificial oxide layer 28 is formed, a crystalline threshold voltage adjust region 26P may be formed, and the roughness of the threshold voltage adjust region 26P may be improved. The threshold voltage adjust region 26P may include a germanium-rich (Ge-rich) region. For example, as silicon is consumed from the top of the threshold voltage adjust region 26 having a SiGe structure by the thermal oxidation process of the post treatment 27, the crystalline threshold voltage adjust region 26P having a large amount of germanium is formed.

As the threshold voltage adjust region 25P is formed, the threshold voltage of the P-channel transistor may be further lowered.

Figure 2C:
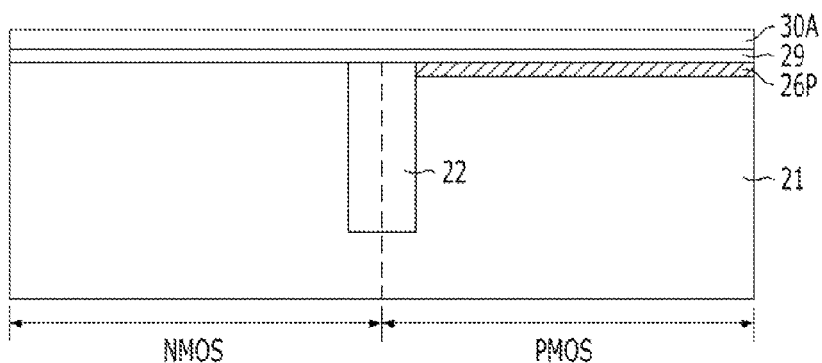

Referring to FIG. 2C, the sacrificial oxide layer 28 is removed through a cleaning process. The cleaning process is performed using a solution containing HF. As the cleaning process is performed, the sacrificial oxide layer 28 on the surface of the substrate 21 may be removed. Simultaneously, a dangling bond on the surface of the substrate 21 may be passivated by hydrogen so as to suppress native oxide from being grown until a subsequent process is performed.

An interface layer 29 is formed over the substrate 21, and a high-k material 30A is formed over the interface layer 29. The interface layer 29 may include silicon oxide or silicon oxynitride. For example, the interface layer 29 may include $SiO_2$ or SiON. The interface layer 29 serves to improve an interface characteristic between the substrate 21 and the high-k material 30A, thereby enhancing an electron mobility characteristic. Silicon oxide to be used as the interface layer 29 may be grown by a wet method using ozone. In particular, if the silicon oxide to be used the interface layer 29 is grown by a wet method using ozone and the high-k material 30A is a silicate material containing hafnium, then hafnium-rich (Hf-rich) hafnium silicate (HfSiO) is formed during the formation of the high-k material 30A. Accordingly, the dielectric constant of the high-k material 30A is increased. The interface layer 29 is formed to a thickness ranging from approximately 5 Å to approximately 13 Å.

The high-k material 30A may be formed of the same material in both of the first and second regions PMOS and NMOS. The high-k material 30A used as the gate dielectric layer includes high-k materials having a high dielectric constant. The high-k material 30A has a high dielectric constant than the dielectric constant (about 3.9) of $SiO_2$ used as a general gate dielectric layer. Furthermore, the high-k material 30A has a considerably larger physical thickness and a lower EOT than $SiO_2$. The high-k material 30A may have a dielectric constant greater than the interface layer 29.

The high-k material 30A includes a metal-containing material such as metal oxide or metal silicate. The metal oxide includes oxide containing a metal such as Hf, Al, La, or Zr. The metal oxide may include hafnium oxide, aluminum oxide, lanthanum oxide, zirconium oxide, or a combination thereof. For example, the metal oxide may include $HfO_2$, $Al_2O_3$, $La_2O_3$, $ZrO_2$, or a combination thereof. The metal silicate includes a silicate containing a metal such as Hf or Zr. For example, the metal silicate may include HfSiO, ZrSiO, or a combination thereof. In this embodiment of the present invention, HfSiO may be used as the high-k material 30A. As the high-k material 30A is formed in the first and second regions PMOS and NMOS at the same time, the process is simplified.

Meanwhile, different materials may be used as the high-k material 30A in each of the first and second regions PMOS and NMOS. The formation process of the high-k material 30A may include a deposition technique suitable for a material to be deposited. For example, the formation process may include chemical vapor deposition (CVD), low-pressure CVD (LPCVD), plasma-enhanced CVD (PECVD), metal-organic CVD (MOCVD), atomic layer deposition (ALD), plasma-enhanced ALD (PEALD), or the like. In order to form a uniform layer, ALD or PEALD may be applied. The high-k material 30A may be formed to a thickness ranging from approximately 15 Å to approximately 60 Å.

Figure 2D:
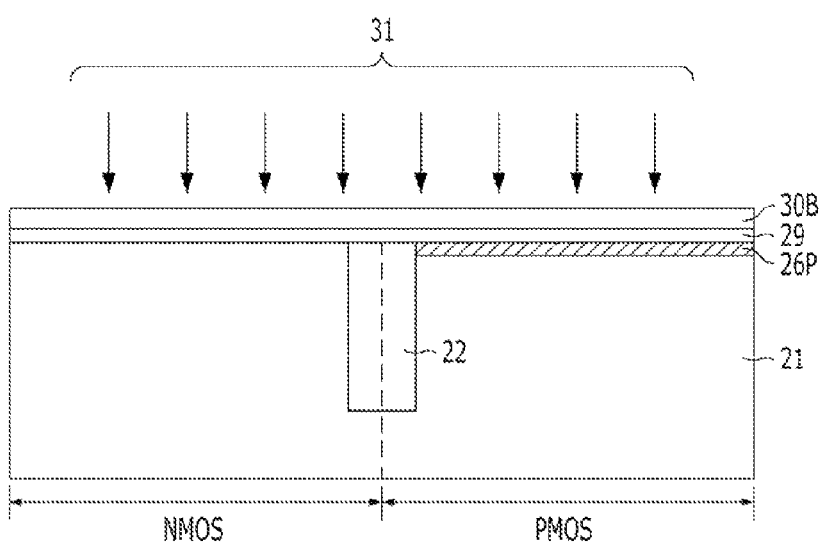

Referring to FIG. 2D, the high-k material 30A may be exposed to a nitridation process 31. The nitridation process 31 includes a plasma nitridation process. Accordingly, nitrogen is implanted into the high-k material 30A. Hereafter, the high-k material into which nitrogen is implanted is represented by reference numeral "30B". For example, when the high-k material 30A is HfSiO, the high-k material 30B of HfSiON may be formed by the nitridation process 31. If nitrogen is implanted into the metal silicate, then the dielectric constant may be increased, and the crystallization of the metal silicate may be suppressed during a subsequent thermal process. The plasma nitridation process may be performed at a temperature ranging from approximately 400° C. to approximately 600° C. Furthermore, during the plasma nitridation process, a gas mixture of argon (Ar) and nitrogen ($N_2$) may be used as reaction gas.

As the high-k material 30A is exposed to nitrogen plasma during the plasma nitridation process, the high-k material 30A, based on metal silicate, becomes the high-k material 30B based on metal silicate nitride. As a nitrogen source for nitrogen plasma, another gas may be used in addition to $N_2$. For example, the nitrogen source may include ammonia ($NH_3$), hydrazine ($N_2H_4$), or the like.

Figure 2E:
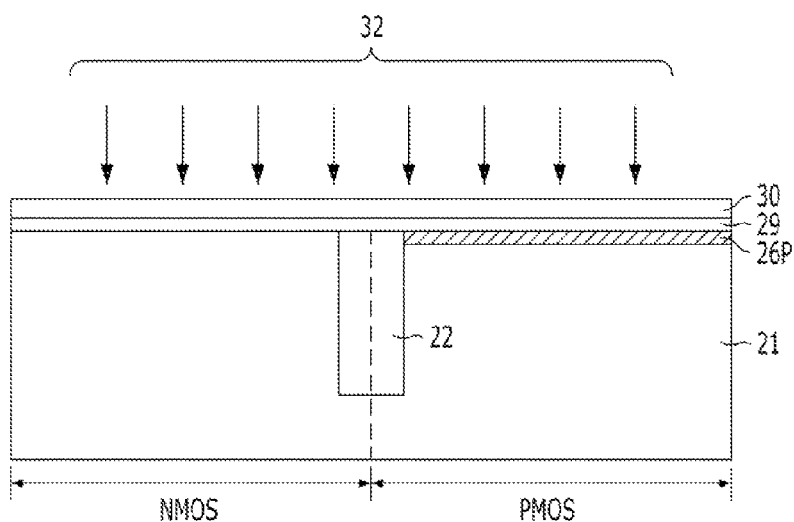

Referring to FIG. 2E, the high-k material 30B is exposed to an annealing process 32. Since the annealing process 32 is performed after the nitridation process 31, the annealing process 32 is referred to as post nitridation anneal. Through the plasma nitridation process, the surface of HfSiO has a metal-containing state. Therefore, when the annealing process 32 is performed, nitrogen atoms implanted into HfSiO may be uniformly diffused inside HfSiO. The annealing process 32 may be performed under an atmosphere of $N_2$ at a temperature ranging from approximately 500° C. to approximately 900° C.

After the annealing process 32 is performed, the high-k material is represented by reference numeral "30". Hereafter, reference numeral "30" represents a gate dielectric layer.

Through the above-described series of the high-k material formation process, the nitridation process 31, and the annealing process 32, the gate dielectric layer 30 having a high dielectric constant is formed. The gate dielectric layer 30 includes high-k materials, or particularly, metal silicate nitride. When the metal silicate nitride is used to form the gate dielectric layer 30, the dielectric constant may be increased. Furthermore, crystallization may be suppressed during a subsequent thermal process. The gate dielectric layer 30 includes a hafnium containing material.

Figure 2F:
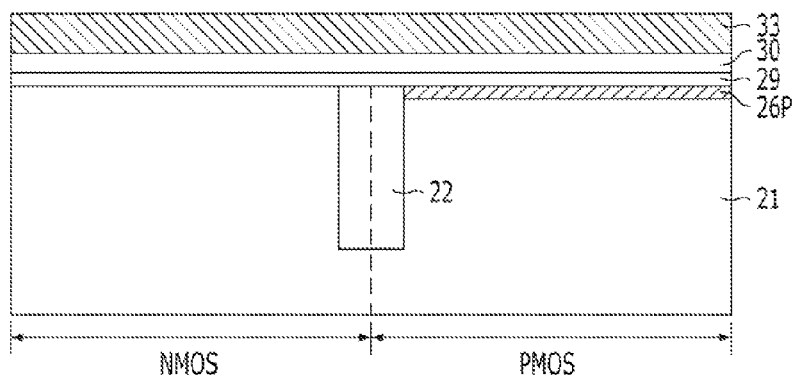

Referring to FIG. 2F, a first metal-containing layer 33 is formed over the gate dielectric layer 30. The first metal-containing layer 33 may be formed over the entire surface of the substrate 21, including the gate dielectric layer 30. The first metal-containing layer 33 may include a first effective work function adjust species. Due to the first effective work function adjust species, the first metal-containing layer 33 has an effective work function suitable for a P-channel transistor. Therefore, the first metal-containing layer 33 may become a P-type effective work function metal-containing layer. The P-type effective work function metal-containing layer may include materials having an effective work function of 4.7 to 5.1 eV. As the first metal-containing layer 33 includes the first effective work function adjust species, a first effective work function of the first metal-containing layer 33 may be changed into a second effective work function greater than the first effective work function. For example, the first effective work function may include a midgap work function. The second effective work function has a value of 4.7 eV or more. The first effective work function adjust species may include an effective work function increase species to increase the effective work function. As the effective work function increase species is contained, the effective work function of the gate stack structure is increased. Therefore, the first metal-containing layer 33 containing the effective work function increase species becomes a high effective work function material. The effective work function increase species may include nitrogen.

The first metal-containing layer 33 may include metal nitride containing nitrogen at a ratio greater than a chemical stoichiometric ratio of metal to nitrogen. The metal nitride may include TiN. The first metal-containing layer 33 may include TiN containing an effective work function increase species. The first metal-containing layer 33 may include nitrogen as the effective work increase species. Therefore, the first metal-containing layer 33 may include N-rich TiN, The N-rich TiN refers to TiN that contains nitrogen at a ratio greater than the chemical stoichiometric ratio of titanium to nitrogen. TiN has a different work function depending on the composition ratio of titanium to nitrogen. For example, the N-rich TiN has an effective work function suitable for a P-channel transistor. On the other hand, Ti-rich TiN has an effective work function suitable for an N-channel transistor. Accordingly, the Ti-rich TiN may have a low effective work function. The N-rich TiN may be formed by a PVD method. Accordingly, it is easy to adjust the composition ratio of titanium to nitrogen within TiN. Since the first metal-containing layer 33 has a high effective work function suitable for the P-channel transistor, N-rich TiN is formed as the first metal-containing layer 33. When the N-rich TiN is formed, a flow rate of nitrogen is selectively controlled to adjust the composition ratio of titanium to nitrogen. For example, the flow rate of nitrogen may be controlled from 20 sccm to 200 sccm. As such, the flow rate of nitrogen may be controlled to form N-rich TiN having a unique work function of 4.7 eV to 5.1 eV. The N-rich TiN may be formed by an ALD method.

Figure 2G:
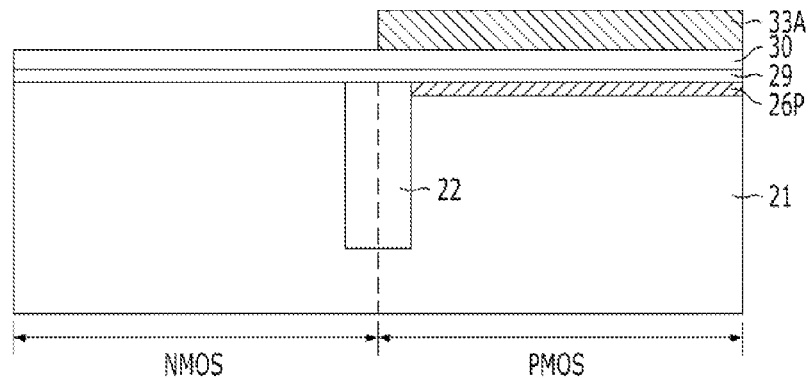

Referring to FIG. 2G, the first metal-containing layer 33 is selectively etched from the second region NMOS so as to be left only in the first region PMOS. Therefore, a first metal-containing layer pattern 33A is formed. Although not illustrated, a mask pattern (not illustrated) to open the second region NMOS may be used to form the first metal-containing layer pattern 33A.

Figure 2H:
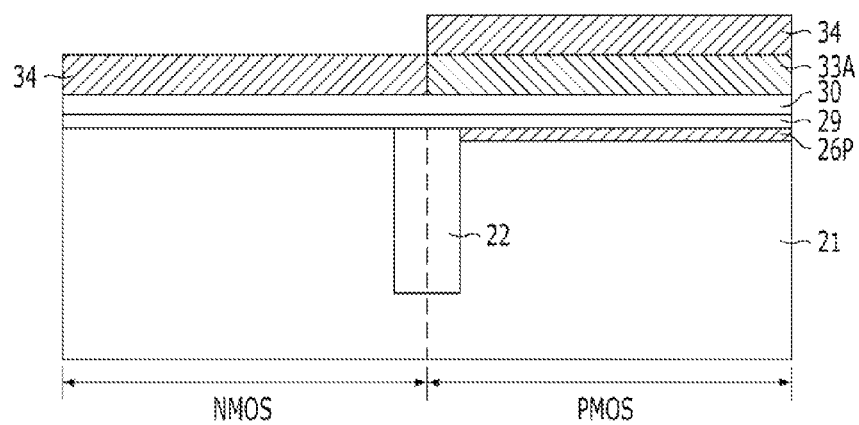

Referring to FIG. 2H, a second metal-containing layer 34 is formed over the entire surface of the resultant structure including the first metal-containing layer pattern 33A. The second metal-containing layer 34 may contain a second effective work function adjust species. Due to the second effective work function species, the second metal-containing layer 34 has an effective work function suitable for the N-channel transistor. Therefore, the second metal-containing layer 34 may become an N-type effective work function metal-containing layer. The N-type effective work function metal-containing layer may include materials having a work function of 4.1 to 4.5 eV. The second effective work function adjust species may include an effective work function decrease species to decrease the effective work function. As the second metal-containing layer 34 includes the second effective work function adjust species, a third effective work function of the second metal-containing layer 34 may be changed into a fourth effective work function smaller than the third effective work function. For example, the third effective work function may include a midgap work function. The fourth effective work function has a value of about 4.5 eV or less. The second effective work function adjust species may include an effective work function decrease species to decrease the effective work function. Therefore, the second metal-containing layer 34 containing the effective work function decrease species becomes a low effective work function material. The effective work function decrease species may include titanium.

The second metal-containing layer 34 may include metal nitride containing metal at a ratio greater than a chemical stoichiometric ratio of metal to nitrogen. The metal nitride may include TiN. The second metal-containing layer 34 may include TiN containing the second effective work function species. The second metal-containing layer 34 may include titanium as the second effective work function species. Therefore, the second metal-containing layer 34 may include Ti-rich TiN. The Ti-rich TiN refers to TiN containing titanium at a ratio greater than a chemical stoichiometric ratio of titanium to nitrogen. TiN has a different work function depending on the composition ratio of titanium to nitrogen. The Ti-rich TiN may be formed by a PVD method. Accordingly, the composition ratio of titanium to nitrogen within TiN may be easily adjusted. Since the second metal-containing layer 34 has a low effective work function suitable for the N-channel transistor, the Ti-rich TiN is formed as the second metal-containing layer 34. When the Ti-rich TiN is formed, the flow rate of nitrogen is selectively controlled to adjust the composition ratio of N to Ti. As such, the flow rate of nitrogen may be controlled to form the Ti-rich TiN having an effective work function of about 4.5 eV or less. The Ti-rich TiN may be formed by an ALD method.

As described above, the second metal-containing layer 34 with a low effective work function is formed in the second region NMOS, and the first metal-containing layer pattern 33A with a high effective work function is formed in the first region PMOS.

Nitrogen contained in the second metal-containing layer 34 may be combined with another element so as to form dipoles. For example, nitrogen has a large electronegativity of about 3.04. Hereafter, nitrogen is referred to as a first element. Therefore, the second metal-containing layer 34 may include a metal-containing layer containing metal and the first element.

Figure 2I:
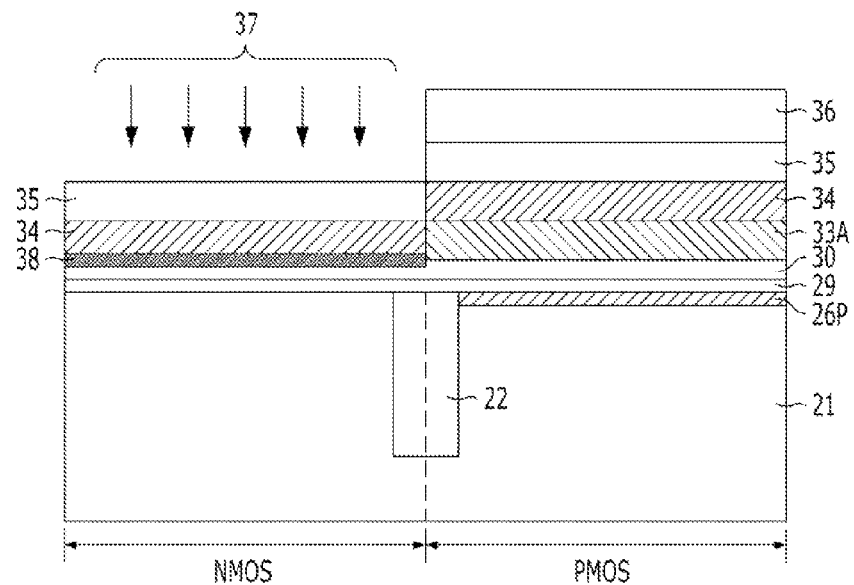

Referring to FIG. 2I, a buffer layer 35 is formed over the entire surface of the resultant structure including the second metal-containing layer 34. The buffer layer 35 is a material for relieving an impact during a subsequent implant process. The buffer layer 35 may include a silicon-containing material. The buffer layer 35 may include silicon, and silicon may include undoped silicon. The buffer layer 35 may be formed to a thickness ranging from approximately 50 Å to approximately 200 Å.

A dipole formation layer 38 is formed at the interface between the second metal-containing layer 34 and the gate dielectric layer 30 of the second region NMOS. The dipole formation layer 38 may include a second element that is combined with the first element forming the second metal-containing layer 34 so as to form a dipole. The dipole formation layer 38 may be formed in the side of the second metal-containing layer 34 at the interface between the second metal-containing layer 34 and the gate dielectric layer 30.

The dipole formation layer 38 is formed by the following method.

A second mask pattern 36 is formed over the buffer layer 35. The second mask pattern 36 may open any one of the first and second regions PMOS and NMOS. Here, the second mask pattern 36 opens the second region NMOS.

The second mask pattern 36 is used as an implant mask to perform an implant process 37 of the second element. The second element may have a different electronegativity from the first element forming the second metal-containing layer 34. The second element may have a second electronegativity smaller than that of the first element.

The second element may include arsenic (As). Arsenic has an electronegativity of about 2.18. Due to an electronegativity difference between nitrogen and arsenic, a dipole may be formed. The second element may include other elements in addition to arsenic. The second element may include an element having a large electronegativity difference from the first element and capable of forming dipoles to reduce the threshold voltage of the N-channel transistor. Examples of the second element may include phosphorous (P), boron (B), or carbon (C). The second element may be selected from elements capable of preventing the degradation of the gate dielectric layer 30. That is, an element which is not diffused into the gate dielectric layer 30 but may be combined with the first element may be selected as the second element. Therefore, arsenic may be selected as the second element. Since arsenic has a low diffusion degree, arsenic is not easily diffused into the gate dielectric layer 30. Therefore, a high concentration of arsenic may be implanted into the interface between the second metal-containing layer 34 and the gate dielectric layer 30.

The implant process 37 of the second element may be performed at an energy ranging from approximately 1 keV to approximately 10 keV and at a dose ranging from approximately $1 \times 10^{14}$ atoms/cm$^2$ to approximately $1 \times 10^{17}$ atoms/cm$^2$. The implant process 37 of the second element is performed in the second metal-containing layer 34. In particular, the implant process 37 may be performed in a region contacted with the gate dielectric layer 30.

Through the implant process 37 of the second element, the dipole formation layer 38 is formed at the interface between the second metal-containing layer 34 and the gate dielectric layer 30. The dipole formation layer 38 includes the first and second elements having different electronegativities, and dipoles are formed by a difference in electronegativity between the first and second elements. The threshold voltage of the N-channel transistor may be reduced by the dipole formation layer 38.

Since the implant process 37 of the second element is performed in the second metal-containing layer 34, the dipole formation layer 38 may become a metal-containing layer containing the first and second elements. For example, the dipole formation layer 38 may become a metal-containing layer that includes nitrogen as the first element and arsenic as the second element. Furthermore, the dipole formation layer 38 may become metal nitride including arsenic. Furthermore, the dipole formation layer 38 may become N-rich TiN including arsenic. Nitrogen, contained at a higher ratio in the N-rich TiN, may be combined with arsenic so as to form a dipole. Accordingly, the effective work function of the gate stack structure may be further lowered.

According to the above-described structure, the gate stack structure including N-rich TiN as the first metal-containing layer 33 has a high effective work function suitable for the P-channel transistor, and the gate stack structure including Ti-rich TiN as the dipole formation layer 38 and the second metal-containing layer 34 has a low effective work function suitable for the N-channel transistor.

Figure 2J:
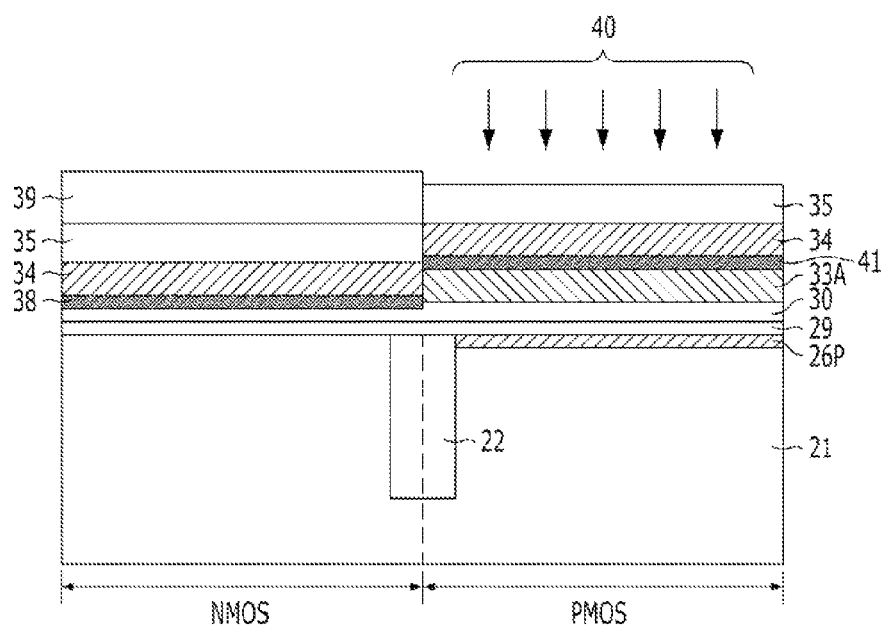

Referring to FIG. 2J, the second mask pattern 36 is removed.

An effective work function promotion layer 41 is formed at the interface between the first metal-containing layer pattern 33A and the second metal-containing layer 34 of the first region PMOS.

The effective work function promotion layer 41 is formed by the following method.

A third mask pattern 39 is formed over the buffer layer 35 in the second region NMOS. The third mask pattern 39 may open any one of the first and second regions PMOS and NMOS. Here, the third mask pattern 39 opens the first region PMOS.

The third mask pattern 39 is used as an implant mask to perform an implant process 40 of a third element. The third element may include aluminum (Al). The implant process 40 of the third element may be performed at an energy ranging from approximately 1 keV to approximately 10 keV and at a dose ranging from approximately $1 \times 10^{14}$ atoms/cm$^2$ to approximately $1 \times 10^{17}$ atoms/cm$^2$. The implant process 40 of the third element is performed at the interface between the second metal-containing layer 34 and the first metal-containing layer pattern 33A.

Through the implant process 40 of the third element, the effective work function promotion layer 41 is formed at the interface between the second metal-containing layer 34 and the first metal-containing layer 33A. Aluminum is a material that increases the effective work function of the gate stack structure. Therefore, the gate stack structure including the effective work function promotion layer 41 may sufficiently secure an effective work function suitable for the P-channel transistor. Furthermore, the effective work function promotion layer 41 may serve to prevent the reaction between the second metal-containing layer 34 and the first metal-containing layer pattern 33A. Since the second metal-containing layer 34 and the first metal-containing layer pattern 33A include a metal nitride, the effective work function promotion layer 41 may include metal nitride containing aluminum. For example, the effective work function promotion layer 41 may include aluminum-containing titanium nitride such as TiAlN.

According to the above-described structure, the gate stack structure, including N-rich TiN as the first metal-containing layer 33 and the effective work function promotion layer 41, has a high effective work function suitable for the P-channel transistor, and the gate stack structure including Ti-rich TiN as the second metal-containing layer 34 and the dipole formation layer 38 has a low effective work function suitable for the N-channel transistor.

Figure 2K:
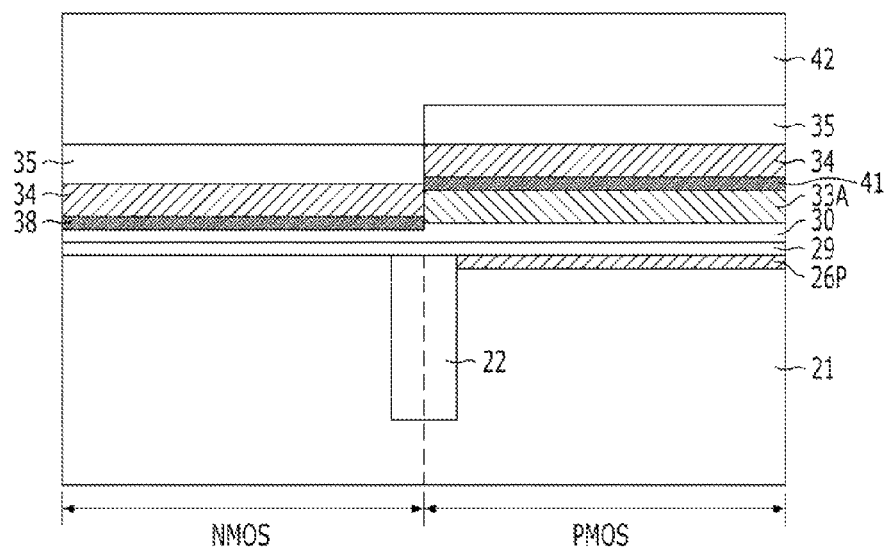
Figure 2L:
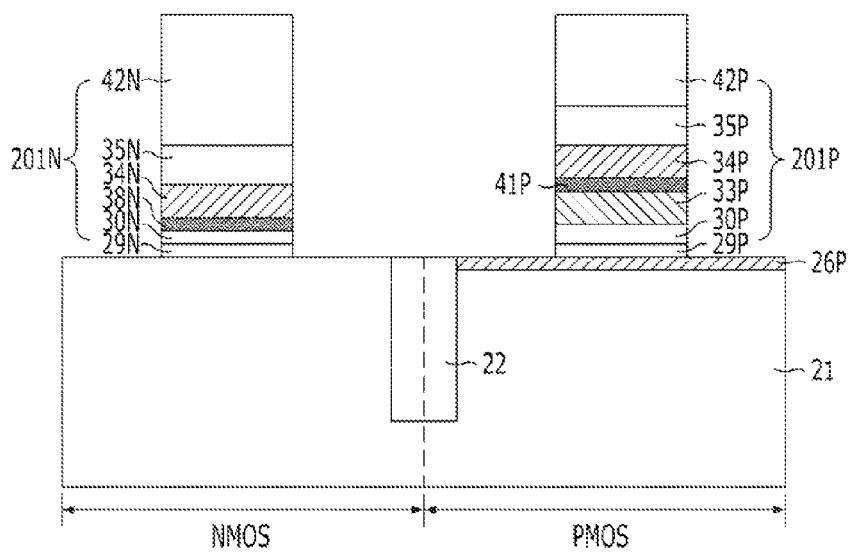

Referring to FIG. 2K, the third mask pattern 39 is removed.

Then, a capping layer 42 is formed over the entire surface of the resultant structure including the buffer layer 35. The capping layer 42 includes a silicon-containing layer. The capping layer 42 may include doped silicon. For example, the capping layer 42 may include N-type silicon or P-type silicon. The buffer layer 35 and the capping layer 42 may serve as an anti-oxidation layer to prevent oxidation of the second metal-containing layer 34.

Since the capping layer 42 may include doped silicon, both of the capping layers formed in the first and second regions PMOS and NMOS may include doped silicon. The capping layer may include an N-type or P-type regardless of the N-channel transistor and the P-channel transistor. That is, N-type silicon or P-type silicon may be used in the first region PMOS, and N-type silicon or P-type silicon may be used in the second region NMOS. Furthermore, both of the first and second regions PMOS and NMOS may be formed of N-type silicon or P-type silicon. In the first and second regions PMOS and NMOS, the capping layer 42 may be formed of the same material or materials having the same conductive type.

Although not illustrated, a low resistance metal-containing layer may be further formed over the capping layer 42. The low resistance metal-containing layer may include tungsten. The low resistance metal-containing layer serves to reduce the resistance of the gate stack structure.

Referring to 2L, a gate mask (not illustrated) is used to perform a gate patterning process.

Accordingly, a first gate stack structure 201P is formed over the substrate 21 of the first region PMOS, and a second gate stack structure 201N is formed over the substrate 21 of the second region NMOS. The first gate stack structure 201P includes a first gate dielectric layer 30P, a first metal-containing gate electrode 33P, an effective work function promotion layer 41P, a metal-containing layer pattern 34P, a first buffer layer 35P, and a first capping layer 42P, which are sequentially stacked. The second gate stack structure 201N includes a second gate dielectric layer 30N, a dipole formation layer 38N, a second metal-containing gate electrode 34N a second buffer layer 35N, and a second capping layer 42N, which are sequentially stacked. That is, the first and second regions PMOS and NMOS have different gate stack structures. The first and second gate stack structures 201P and 201N further include first and second interface layers 29P and 29N formed under the first and second gate dielectric layers 30P and 30N, respectively. The threshold voltage adjust region 26P is formed in the substrate 21 under the first gate stack structure 201P. That is, the threshold voltage adjust region 26P is formed in the P-channel.

Figure 2M:
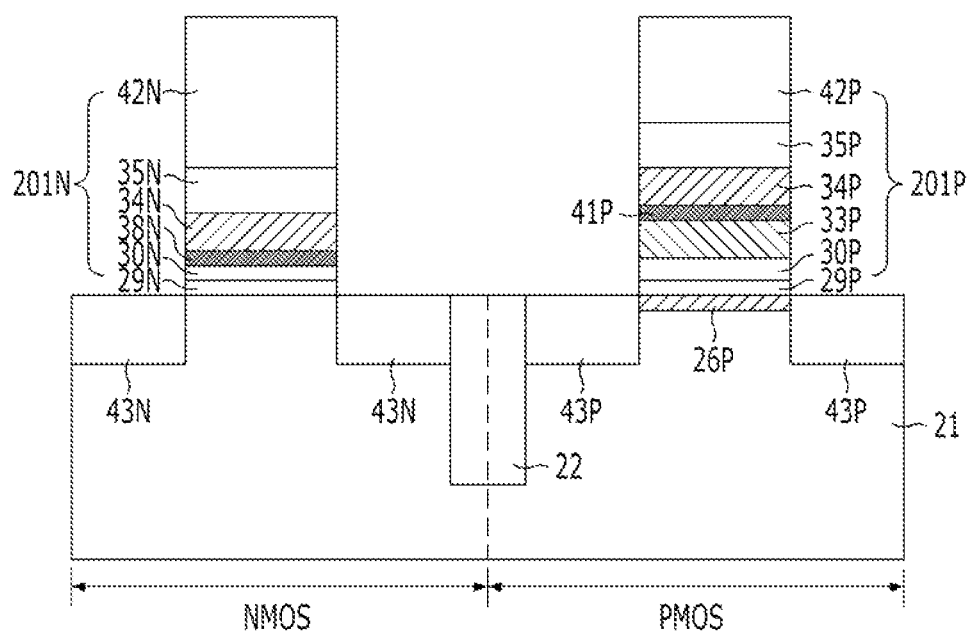

Referring to FIG. 2M processes known in the art may be performed after the gate patterning process. For example, a source/drain formation process may be performed. The source and drain may include an N-type source and drain 43N and a P-type source and drain. The N-type source and drain 43N are formed in the second region NMOS. The P-type source and drain 43P are formed in the first region PMOS. The threshold voltage adjust region 26P is formed in the P-channel between the P-type source and drain 43P.

As the P-type source and drain 43P and the N-type source and drain 43N are formed, first and second transistors are formed. The first transistor includes the first gate stack structure 201P, and the second transistor includes the second gate stack structure 201N. The first transistor is a P-channel transistor including PMOS, and the second transistor is an N-channel transistor including NMOS. The first transistor includes the threshold voltage adjust region 26P formed in the channel region.

In accordance with an exemplary embodiment, the second gate stack structure 201N includes the dipole formation layer 38N, formed at the interface between the second metal-containing gate electrode 34N, and the second gate dielectric layer 30N. Accordingly, the threshold voltage of the N-channel transistor may be reduced. Specifically, according to a difference in electronegativity between elements contained in the dipole formation layer 38N formed at the interface between the second metal-containing gate electrode 34N and the second gate dielectric layer 30N, dipoles are formed. The dipoles reduce the threshold voltage of the N-channel transistor. Furthermore, as the second gate stack structure 201N includes the second metal-containing gate electrode 34N as a low effective work function material, the effective work function of the second gate stack structure 201N may be decreased to further reduce the threshold voltage.

Since the threshold voltage adjust region 26P is formed under the first gate stack structure 201P, the threshold voltage of the P-channel transistor may be reduced. Specifically, as the region containing a large amount of germanium is formed in the P-channel, energy band gap reduction occurs. Accordingly, the threshold voltage may be adjusted to a threshold voltage suitable for the P-channel transistor. Furthermore, as the first gate stack structure 201P includes the first metal-containing gate electrode 33P, which is a high effective work function material, and the effective work function promotion layer 41P, the threshold voltage of the P-channel transistor may be further reduced.

In accordance with an exemplary embodiment, the threshold voltages of the N-channel transistor and the P-channel transistor may be independently controlled during the integration process of the CMOS device.

An exemplary CMOS device may be applied to a DRAM (Dynamic Random Access Memory). Without being limited thereto, however, an exemplary CMOS device may be applied to a SRAM (Static Random Access Memory), flash memory, FeRAM (Ferroelectric Random Access Memory), MRAM (Magnetic Random Access Memory), PRAM (Phase Change Random Access Memory), or the like.

Figure 3:
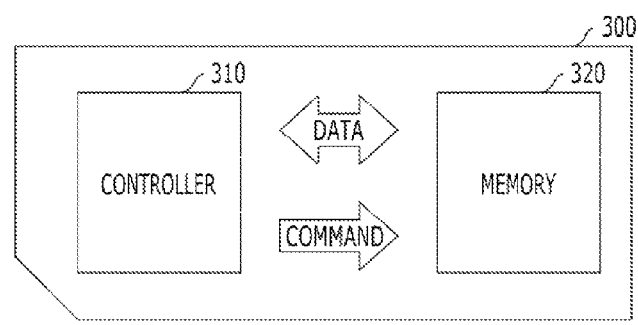
FIG. 3 is a schematic view of an exemplary memory card.

FIG. 3 is a schematic view of a memory card. Referring to FIG. 3, the memory card 300 may include a controller 310 and a memory 320. The controller 310 and the memory 320 may exchange electrical signals. For example, the memory 320 and the controller 310 may exchange data according to a command of the controller 310. Accordingly, the memory card 300 may store data in the memory 320, or output data from the memory 320 to the outside. The memory 320 may include an above-described exemplary CMOS device. The memory card 300 may be used as data storage media of various portable devices. For example, the memory card 300 may include a memory stick card, a smart media card (SM), a secure digital card (SD), a mini secure digital card (mini SD), or a multi-media card (MMC).

Figure 4:
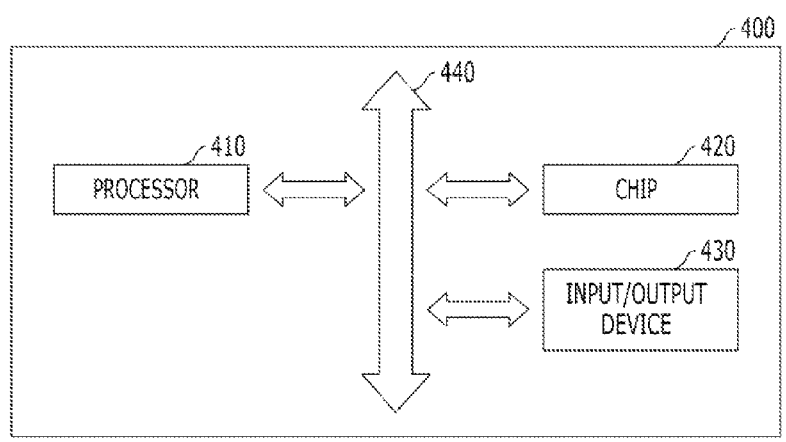
FIG. 4 is a block diagram illustrating an exemplary electronic system.

FIG. 4 is a block diagram illustrating an electronic system. Referring to FIG. 4, the electronic system 400 may include a processor 410, an input/output device 430, and a chip 420, which perform data communication through a bus 440. The processor 410 serves to perform a program operation and control the electronic system 400. The input/output device 430 may be used to input or output data of the electronic system 400. The electronic system 400 may be connected to an external device, for example, a personal computer or network, and exchange data with the external device through the input/output device 430. The chip 420 may store codes and data for the operation of the processor 410, and may process a part of operations assigned by the processor 410. For example, the chip 420 may include an above-described exemplary CMOS device. The electronic system 400 may form various electronic control devices requiring the chip 420. For example, the electronic system 400 may be applied to a mobile phone, an MP3 player, a navigation system, a solid state disk (SSD), or household appliances.

In accordance with an exemplary embodiment, since germanium is contained in the P-channel, the energy band gap of the P-channel may be reduced to decrease the threshold voltage of the P-channel transistor. Furthermore, since the metal-containing gate electrode is used as a high effective work function material, the threshold voltage of the P-channel transistor may be further reduced. Furthermore, as the effective work function promotion layer is formed over the metal-containing gate electrode containing, at a higher ratio, the effective work function increase species, the effective work function of the gate stack structure may be sufficiently secured.

In addition, as the dipole formation layer is formed at the interface between the metal-containing gate electrode and the gate dielectric layer, the threshold voltage of the N-channel transistor may be reduced. Furthermore, since an element for forming a dipole is added to the metal-containing gate electrode, the reliability of the gate dielectric layer is not degraded, or the dielectric constant of the gate dielectric layer is not changed. Furthermore, since the metal-containing gate electrode containing, at a higher ratio, the effective work function decrease species is formed, the effective work function of the gate stack structure may be sufficiently lowered.

In addition, as the effective work function promotion layer is formed as the gate stack of the P-channel transistor over the first metal-containing gate electrode, the process of removing the second metal-containing gate electrode may be omitted. Accordingly, the process may be simplified.

Therefore, during the CMOS integration process, the threshold voltages of the N-channel transistor and the P-channel transistor may be independently adjusted.

Although an exemplary embodiment has have been described for illustrative purposes, it will be apparent to those skilled in the art that various changes and modifications may be made without departing from the spirit and scope of the invention as defined in the following claims.

What is claimed is:

1. A method for fabricating a semiconductor device, the method comprising:
    forming a threshold voltage adjust region under a surface of a first region of a substrate that includes the first region and a second region;
    forming a gate dielectric layer over the first region and the second region;
    forming a first metal-containing layer containing a first effective work function adjust species over the gate dielectric layer formed over first region;
    forming a second metal-containing layer containing a second effective work function adjust species over the gate dielectric layer formed over the second region and over the first metal-containing layer;
    forming a dipole formation region at an interface between the second metal-containing layer and the gate dielectric layer;
    forming an effective work function promotion layer at an interface between the first metal-containing layer and the second metal-containing layer;

forming, in the first region, a first gate stack structure by etching the second metal-containing layer, the effective work function promotion layer, the first metal-containing layer, and the gate dielectric layer; and forming, in the second region, a second gate stack structure by etching the second metal-containing layer, the dipole formation layer, and the gate dielectric layer, wherein the forming the dipole formation layer comprises:
  forming a buffer layer over the second metal-containing layer;
  forming a mask pattern over the buffer layer, the mask pattern opening the second region; and
  implanting, via the mask pattern, a second element into a portion of the second metal-containing layer.

2. The method of claim 1, wherein the second metal-containing layer comprises a first element having a first electronegativity value, and
  the forming the dipole formation layer comprises implanting the second element having a second electronegativity value that is different than the first electronegativity value.

3. The method of claim 2, wherein the first element comprises nitrogen, and the second element comprises arsenic.

4. The method of claim 1, wherein the first effective work function adjust species comprises nitrogen, and the second effective work function adjust species comprises titanium.

5. The method of claim 1, wherein the first metal containing layer comprises nitrogen rich (N-rich) titanium nitride (TiN), and the second metal containing layer comprises titanium rich (Ti-rich) TiN.

6. The method of claim 1, wherein the effective work function promotion layer comprises TiN containing aluminum.

7. The method of claim 1, wherein the forming the effective work function promotion layer comprises:
  forming a buffer layer over the second metal-containing layer;
  forming a mask pattern over the buffer layer, the mask pattern opening the first region; and
  implanting, via the mask pattern, aluminum into an interface between the first metal-containing layer and the second metal-containing layer.

8. The method of claim 1, further comprising:
  forming, below the gate dielectric layer, an interface layer over the substrate, and
  wherein the gate dielectric layer comprises a high-k material having a dielectric constant greater than a dielectric constant of the interface layer.

* * * * *